(12) United States Patent
Croft et al.

(10) Patent No.: US 8,833,005 B1
(45) Date of Patent: Sep. 16, 2014

(54) BASE SHEET INTEGRATED PHOTOVOLTAIC ROOFING ASSEMBLIES

(75) Inventors: Steven T. Croft, Menlo Park, CA (US); Shawn Everson, Fremont, CA (US)

(73) Assignee: Hanergy Holding Group Ltd, Beijing (CN)

( * ) Notice: Subject to any disclaimer, the term of this patent is extended or adjusted under 35 U.S.C. 154(b) by 0 days.

(21) Appl. No.: 13/085,268

(22) Filed: Apr. 12, 2011

(51) Int. Cl.
*E04D 13/18* (2014.01)

(52) U.S. Cl.
USPC .......................... 52/173.3; 136/251; 126/622

(58) Field of Classification Search
USPC .......... 52/173.3; 126/704; 136/244, 246, 251, 136/259, 291; 257/433
See application file for complete search history.

(56) References Cited

U.S. PATENT DOCUMENTS

| | | | |
|---|---|---|---|
| 6,201,180 B1 * | 3/2001 | Meyer et al. | 136/244 |
| 6,360,497 B1 * | 3/2002 | Nakazima et al. | 52/173.3 |
| 6,649,822 B2 * | 11/2003 | Eguchi et al. | 136/251 |
| 2003/0184257 A1 * | 10/2003 | Nomura et al. | 320/101 |
| 2004/0226247 A1 * | 11/2004 | Byrd | 52/518 |
| 2004/0244827 A1 * | 12/2004 | Hatsukaiwa et al. | 136/243 |
| 2006/0042683 A1 * | 3/2006 | Gangemi | 136/252 |
| 2008/0289272 A1 * | 11/2008 | Flaherty et al. | 52/173.3 |
| 2010/0050569 A1 * | 3/2010 | Dutra | 52/836 |
| 2010/0078058 A1 * | 4/2010 | Nightingale et al. | 136/244 |
| 2010/0236541 A1 * | 9/2010 | Smith et al. | 126/621 |
| 2010/0313501 A1 * | 12/2010 | Gangemi | 52/173.3 |

\* cited by examiner

*Primary Examiner* — William Gilbert
*Assistant Examiner* — Beth Stephan
(74) *Attorney, Agent, or Firm* — Weaver Austin Villeneuve & Sampson LLP

(57) ABSTRACT

Provided are novel building integrable photovoltaic (BIP) assemblies and methods of installation thereof on building structures. The BIP assembly includes a base sheet or a sheath, which may be a plywood board or an oriented strand (OSB) board, and multiple electrically interconnected photovoltaic inserts, which are attached to and supported by the base sheet. The base sheet is configured to be positioned directly the building structures, such as roof rafters. Various electrical components may be positioned within cavities of the base sheet and/or at the back side of that sheet. Such components are configured to align in between the roof rafters during installation. The spacing between the rafters provides access to the components and allows the components to extend away from the base sheet and into the spacing. Various electrical components may be installed and removed from the BIP assembly during its fabrication and/or installation.

20 Claims, 5 Drawing Sheets

BASE SHEET INTEGRATED PHOTOVOLTAIC ROOFING ASSEMBLIES

BACKGROUND

Photovoltaic cells are widely used for electricity generation with one or more photovoltaic cells typically sealed within a module. Multiple modules are then arranged into photovoltaic arrays that are used to convert solar energy into electricity by the photovoltaic effect. Photovoltaic arrays can be installed on building rooftops, other building structures, or mounting structures and are used to provide electricity to the buildings and to the general electrical grid.

SUMMARY

Provided are novel building integrable photovoltaic (BIP) assemblies and methods of installation thereof on building structures. The BIP assembly includes a base sheet or a sheath, which may be a plywood board or an oriented strand (OSB) board, and multiple electrically interconnected photovoltaic inserts, which are attached to and supported by the base sheet. The base sheet is configured to be positioned directly on the building structural members, in particular roof rafters. Various electrical components may be positioned within cavities of the base sheet and/or on the back side of the sheet. Such components are configured to align in between the roof rafters, or other structural members at the installation point, during installation. For example, the components may be positioned on the back side of the base sheet so that they will not conflict with the contact points of the back sheet with building structural members, such as roof rafters, spaced according to standard building codes. The spacing between the rafters provides access to the components and allows the components to extend away from the base sheet and into the spacing, if necessary. Various electrical components may be installed and removed from the BIP assembly during or after its fabrication and/or installation.

In certain embodiments, a BIP assembly includes multiple electrically interconnected photovoltaic inserts and a base sheet supporting the inserts. Each photovoltaic insert may include one or more photovoltaic cells and a set of electrical leads extending from the insert. The inserts may be electrically interconnected with each other in the BIP assembly. The base sheet has a front side supporting the inserts and a back side for attaching to a building structure, such as roof rafters. Furthermore, the base sheet may have multiple through holes or cavities corresponding to the photovoltaic inserts. In certain embodiments, the electrical leads of the inserts extend into the through holes or cavities to establish electrical connections with other electrical components of the BIP assembly and array. In other embodiments, electrical connections between the inserts are made at the front side of the base sheet. The base sheet may be made from a plywood board and/or an oriented strand board (OSB) or other suitable building sheathing, in particular roof sheathing, material. The sheet may have standard dimensions for building sheathing materials, for example about 4 feet wide by about 8 feet long, or other suitable dimensions.

In certain embodiments, the base sheet includes a back side cavity configured to accommodate a component box, such as a junction box for making electrical connections with other BIP assemblies or electrical components of the photovoltaic array. The component box may also be configured to accommodate an inverter or other electrical components inside the component box. In certain embodiments, the component box may be fully enclosed within the cavity, i.e., the box does not extend beyond the front side and/or the back side of the base sheet. The component box may include a connector for connecting an inverter or other electrical components. In certain embodiments, an inverter is configured to fit inside the component box. More specifically, the inverter may be installable into and removable from the component box depending on the installation requirements of the BIP assembly. In certain embodiments, an inverter is provided as a part of the BIP assembly and installed in the component box during fabrication of the BIP assembly. In other embodiments, a junction box or component box may be installed on the back side of the base sheet without a cavity and configured to align in between the roof rafters, or other structural members, at the installation point.

In certain embodiments, the through holes and/or the back side cavity are configured to align between standard building structural member spacing at the installation point, for example roof rafters of the building structure. This feature enables clearance for and access to electrical leads and other electrical components of the BIP assembly during and after installation in the areas between the roof rafters. The BIP assembly may also include an electrical connector for electrically interconnecting the assembly with one or more adjacent assemblies. The electrical connector is typically positioned along an edge of the base sheet. More specifically, the electrical connector may be positioned near a corner of the base sheet. This location of the electrical connector eliminates a need for accessing and establishing electrical connections in tight corners of building structures, e.g., near the pinch point created by joists and roof rafters.

The inserts may be arranged into one or more rows, such that each row includes a separate set of the interconnected inserts. Each row may be offset with respect to other adjacent rows to improve moisture sealing and other characteristics of the assembly. The BIP assembly may also include a sealing strip or a spacer provided in between the photovoltaic inserts to protect the base sheet from the environment and/or to support the inserts with respect to the base sheet. In the same or other embodiments, the BIP assembly includes one or more edge flaps extending from one or both edges and configured to extend under or over adjacent BIP assemblies during installation.

The base sheet may include cooling perforations exposing some back sides of the photovoltaic inserts. The cooling perforations may be also used for extending the electrical terminals from the inserts to the back side of the base sheet, for example to make electrical connections to other inserts and assemblies. In certain embodiments, a BIP assembly includes one or more nail pointers positioned in the gaps between the photovoltaic inserts. The nail pointers may include markings on the front side of the base sheet or complete through holes. The BIP assembly may also include nail cover flaps corresponding to nail pointers or the gaps. The nail cover flaps are configured to seal the nailing areas after installation of the assembly and protruding nails or other mechanical fasteners through the base sheet. In certain embodiments, a BIP assembly includes aligning features provided on the back side of the base sheet and configured to align the assembly with respect to various components of the building structure, such as roof rafters.

These and other aspects of the invention are described further below with reference to the figures.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Building-integrable photovoltaic (BIP) modules are photovoltaic modules specially configured for integration into various parts of building structures, such as rooftops, skylights, or facades. In certain examples, the BIP modules are used to replace conventional building materials, such as asphalt shingles. Unlike conventional photovoltaic systems, the BIP modules often do not require separate mounting hardware and may be installed directly onto the building structures and even replace some building materials. As such, installed BIP modules provide substantial savings over conventional systems in terms of building materials and labor costs. For example, asphalt roof shingles may be completely or partially replaced by BIP modules referred to as "photovoltaic shingles." In certain embodiments, photovoltaic shingles are installed on the same base roof structure as asphalt shingles. However, relatively small photovoltaic shingles require making a substantial number of electrical connections in the field (e.g., on or under the rooftop) as well as scaling multiple interfaces between the shingles. These operations are very labor intensive and may generate poor results.

Novel BIP assemblies described herein transform integration of photovoltaic systems into building structures. For example, large format BIP assemblies (e.g., 4 by 8 foot sheets) may be installed directly onto roof rafters without a need for intermediate roof boards/sheathing. Furthermore, multiple photovoltaic inserts supported by the base sheet may be electrically interconnected and sealed during fabrication of the BIP assembly thereby eliminating these operations in the field.

Figure 1:
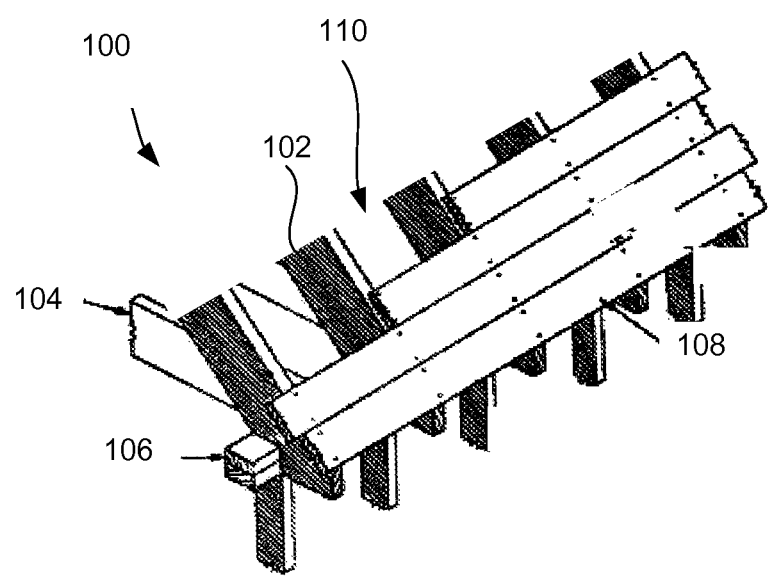
FIG. 1 is a schematic representation of a roofing structure in accordance with certain embodiments.

FIG. 1 is a schematic representation of a roofing structure 100 in accordance with certain embodiments. Roofing structure 100 is shown to have roof rafters 102 secured to plates 106 and joists 104. Plates 106 may be supported by studs of the wall structures or other building components. Roof boards 108 are attached to roof rafters 102 and are used to support roofing materials (e.g., asphalt shingles) and/or photovoltaic components (e.g., photovoltaic shingles). Roof boards 108 may be made from individual wooden planks or large format boards, e.g., 4 foot wide by 8 foot long plywood boards or oriented strand boards (OSBs).

Rafters 102 are typically made from wooden beams having rectangular cross-sections, such as 2 inches by 4 inches, 2 inches by 6 inches, 2 inches by 8 inches, 2 inches by 10 inches, or 2 inches by 12 inches. These are considered to be "standard" dimensions, while the actual physical dimensions may be slightly different. Other materials, cross-sectional profiles and dimensions can be used for rafters 102 as well. Rafters 102 are generally spaced apart at a certain predetermined distance, such as about 16 inches, about 19.2 inches, or about 24 inches for wooden rafters used in the United States. The size and spacing of the rafters may be determined by local construction requirements (e.g., building codes), supporting loads (e.g., different roofing materials), rafter materials, and other factors. BIP assemblies in accordance with the present invention may be configured for a variety of standard rafter spacings during manufacture, and labeled and marketed as such so that the contemplated connector clearance can be achieved with each spacing by selection of the appropriate BIP assembly.

Rafters 102 are shown to form large openings 110 in between each pair of adjacent rafters 102. For example, two adjacent rafters that have cross-section profiles of 2 inches by 12 inches and spaced apart by 24 inches form an opening that is 12 inches deep and 24 inches wide. Openings 110 may be used to access back sides of roof boards 108. The proposed BIP assemblies replace roof boards 108 shown in FIG. 1. As such, openings 110 may be used to access back sides of the BIP assemblies, for example, to establish electrical connections between the assemblies and other array components, install or remove various electrical connections, and other purposes. For example, an inverter may be attached to the back side of the base sheet of the BIP assembly through one of openings 110. The inverter may extend into this opening. In other embodiments further described below, an inverter is fully integrable into a base sheet of the BIP assembly and the opening is used for access and possibly wiring.

Rafters 102 may form an acute angle with joists 104 as shown in FIG. 1. It may be not desirable and may be even prohibited by the building codes to form electrical connections between such rafters 102 and joists 104 in the pinch area close to plates 106. At the same time, many new photovoltaic modules, such as photovoltaic shingles, tend to be small relative to conventional photovoltaic module dimensions. When these small modules are positioned along the bottom edge of the roof, their electrical leads extend into the pinch area. The leads often need to be extended for connection in other areas, which further adds to installation costs and complexities. Furthermore, each small module generally has its own set of electrical leads that needs to be connected to the overall circuit. These connections are conventionally made in the field. Not only are these connections that are difficult to make, they may also be substantially less robust then factory made connections.

It has been proposed to use a pre-fabricated BIP assembly that includes a large format base sheet (e.g., 4 feet wide by 8 feet long) and multiple electrically interconnected photovoltaic inserts attached to the sheet. The base sheet is configured to be nailed or otherwise mechanically attached directly to roof rafters 108 or some other building structural members. Various electrical components, such as inverters and electrical leads, may be positioned within the base sheet or attached to back side of the base sheets in such a way that they align with openings 110 during installation.

Figure 2:
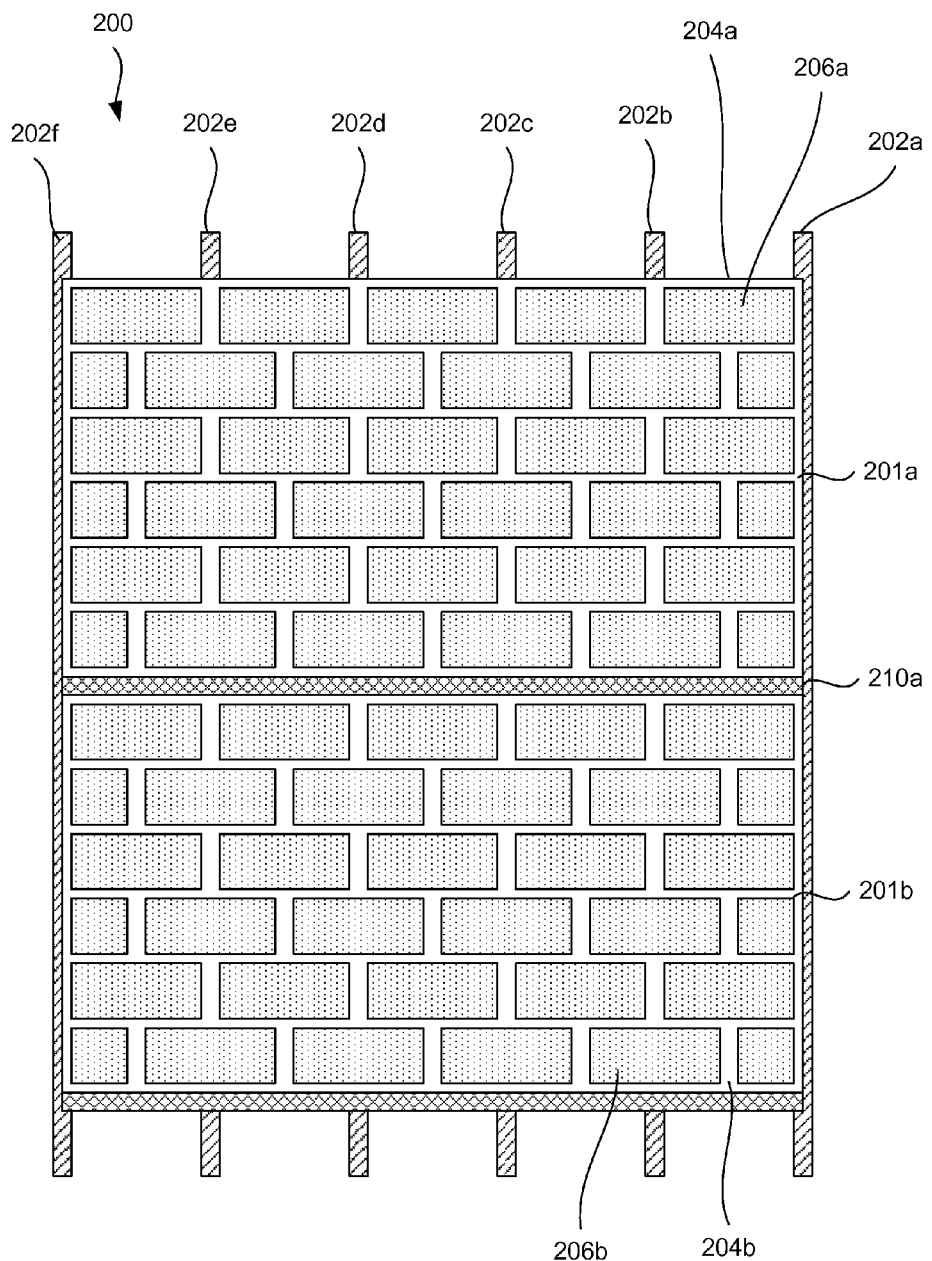
FIG. 2 is a schematic top view of two building integrable photovoltaic (BIP) assemblies positioned on six roof rafters in accordance with certain embodiments.

FIG. 2 is a schematic top view of a photovoltaic array 200 including two BIP assemblies 201a and 201b supported by six roof rafters 202a-202f in accordance with certain embodiments. BIP assembly 201a includes a base sheet 204a with multiple electrically interconnected photovoltaic inserts 206a attached to it. Base sheet 204a has a front side (or a top side) supporting inserts 206a and a back side (or a bottom side) for attaching to a building structure, such as roof rafters 202a-202f. Similarly, BIP assembly 201b includes photovoltaic inserts 206b attached to a base sheet 204b.

Photovoltaic inserts 206a may include one or more photovoltaic cells, such as copper indium gallium selenide (CIGS) cells or other types of photovoltaic cells described above. In a particular embodiment, each photovoltaic insert includes at least ten CIGS cells electrically interconnected in series. Photovoltaic inserts 206a may be arranged into one or more rows. For example, FIG. 2 illustrates photovoltaic inserts 206a arranged into six rows on base sheet 204a. Each row may represent a separate set of electrically interconnected inserts. For example, six inserts in the first row (from the top) may be interconnected in series as a set, each set having its own set of electrical leads for connecting to a photovoltaic array. In other embodiments, all inserts of the same BIP assembly are electrically interconnected and the assembly includes only one set of electrical leads. In yet another embodiment, each insert has its own separate set of electrical leads.

Photovoltaic inserts 206a in one row may be offset with respect to similar inserts in other adjacent rows as shown in FIG. 2. The offset may help to provide a better moisture seal and/or for mechanical support of the inserts. Furthermore, BIP assembly 201a may have an edge flap 210a for sealing an interface between assemblies 201a and 201b. Edge flap 210a may be a flexible component permanently attached to and sealed to base sheet 204a. Edge flap 210a is typically configured to extend over a portion of BIP assembly 201b during installation.

In certain embodiments, base sheets 204a and 204b are made of plywood boards and/or OSBs. These base sheet materials are relatively inexpensive and allow for seamless integration into existing building structures. For example, roofing structures often use large format roof boards, such as conventional 4 by 8 foot plywood boards and/or OSBs attached to the rafters and covered by various exterior roofing materials, such as asphalt shingles. The proposed BIP assemblies can be used in addition to or as a replacement of these conventional roofing materials. For example, base sheets may be about 4 feet wide and about 8 feet long similar to conventional roof boards. An 8 foot long BIP assembly will fit on rafters that are 16 inches apart (the BIP assembly supported by 7 rafters), rafters that are 19.2 inches apart (supported by 6 rafters), or rafters that are 24 inches apart (supported by 5 rafters). Some BIP assemblies may be made into smaller formats to fill smaller remaining areas of the roof tops. Furthermore, BIP assemblies may be supplied together with a look-a-like roof boards (i.e., "dummy" boards) that do not include photovoltaic inserts or photovoltaic cells. These boards may be cut in the field into various sizes and used to functionally and aesthetically integrate with the BIP assemblies on the same rooftop. These look-a-like boards may include edge flaps and other features for more seamless integrations with the BIP assemblies.

Photovoltaic inserts 206a may be positioned on base sheet 204a such that some gaps are provided between inserts 206a. Some of these gaps may be used for attaching BIP assembly 201a to roof rafters 202a-202f. For example, rafters 202b, 202c, 202d, and 202e are positioned in between inserts 206a in the first, third, and fifth rows. The gaps between the inserts in these three rows may be used to drive nails or other mechanical fasteners through base sheet 204a and into rafters 202b, 202c, 202d, and 202e without damaging photovoltaic inserts 206a. In certain embodiments, a liner may be provided in between a base sheet and photovoltaic inserts. The liner may be used as a moisture barrier and/or an electrical insulator. One example includes VERSASHIELD® supplied by Halex Corporation in Pomona, Calif.

Figure 3A:
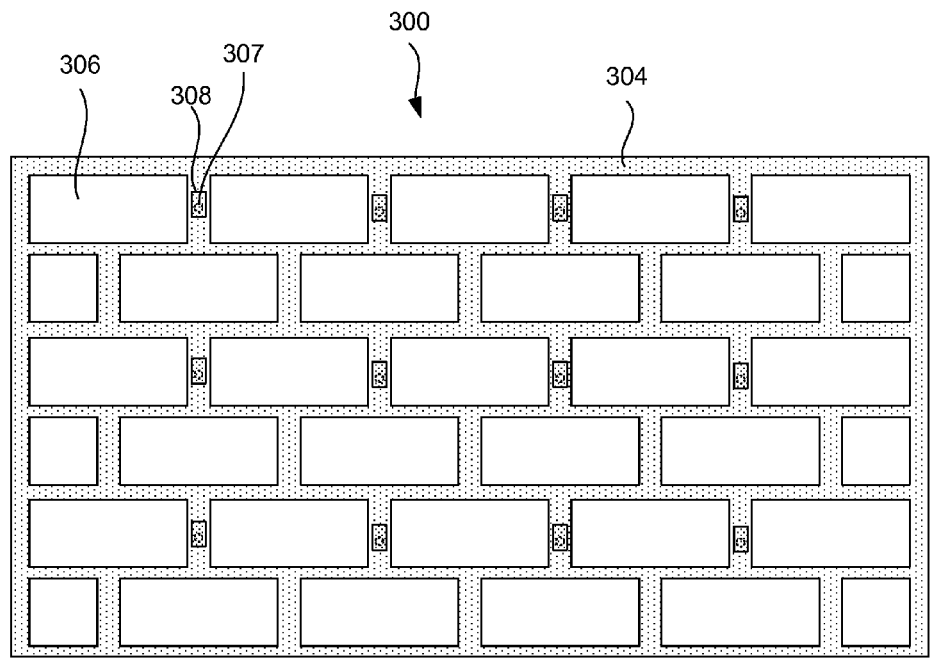
FIG. 3A is a schematic top view of a BIP assembly in accordance with certain embodiments.

FIG. 3A is a schematic top view of a BIP assembly 300 including a base sheet 304 and photovoltaic inserts 306 disposed on base sheet 304 in accordance with certain embodiments. As mentioned above certain gaps between inserts 306 may be used for attaching BIP assembly 300 to a building structure. These gaps may identified with and/or include nail pointers 307. Nail pointers may be markings on the front surface of base sheet 304 or some other indications. In certain embodiments, nail pointers 307 are through holes configured to accept a nail or some other mechanical fastener for attachment to the building structure. The gaps may include nail cover flaps 308 that may be used to seal an area of mechanical fastening. Mechanical fastening often involves through holes (prefabricated or made during field installation) penetrating base sheet 304, and the entry points into these through holes need to be sealed over. Nail cover flaps 308 may be used for this purpose.

Figure 3B:
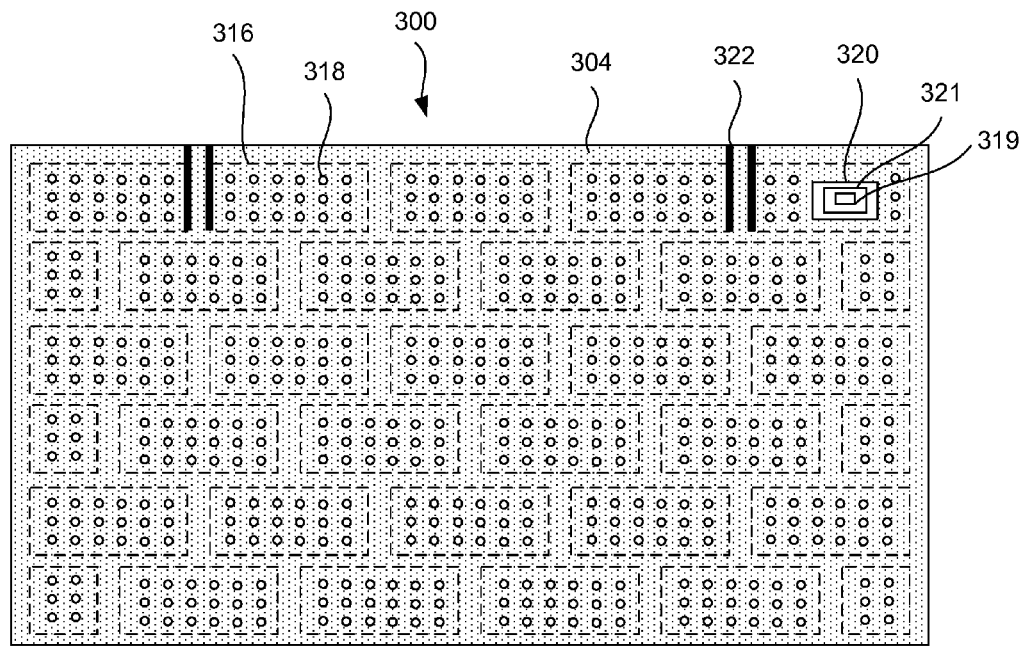
FIG. 3B is a schematic bottom view of the same BIP assembly in accordance with certain embodiments.

FIG. 3B is a schematic bottom view of BIP assembly 300 in accordance with certain embodiments. Base sheet 304 is shown to have cooling perforations 318. Cooling perforations 318 may be through holes positioned within each photovoltaic insert boundary, which is identified by dotted lines 316. Cooling perforations 318 may be sufficiently large to provide air flow to the back sides of the inserts. Many photovoltaic inserts are known to operate more efficiently when the temperature of the insert is controlled or at least when the insert is kept from overheating. These or other perforations may be used to feed electrical leads from individual photovoltaic inserts to the back side of base sheet 306 when the inserts' connections are interconnected at the back side.

Base sheet 304 may include a back side cavity 320 configured to accommodate a component box or other some electrical components. In certain embodiments, back side cavity 320 positioned along one edges of base sheet 304 or, more specifically, near one corner of base sheet 304. Such locations of cavity 320 help to avoid installation of electrical connectors and components in hard to reach places such as near pinch points formed by the roof rafters and joists. BIP assembly 300 may include multiple cavities, e.g., a cavity corresponding to each of photovoltaic inserts. One or more cavities 320 may be positioned in such a way that they will be located in between roof rafters after installation of the BIP module on the roofing structure.

Cavity 320 may include a component box 321 for making electrical connections, positioning electrical components (e.g., inverters), and/or other purposes. For example, the component box may include a connector for connecting an inverter, other BIP assemblies, or various other electrical components of the photovoltaic array. An inverter 319 may be supplied as a part of the BIP assembly and positioned inside the component box during fabrication of the BIP assembly. In certain embodiments, an inverter is installable into the component box and/or removable from the component box after fabrication of the BIP assembly and/or during or after installation of the BIP assembly on the building structure. In certain embodiments, the component box does not extend beyond the front side and/or the back side of the base sheet. This embodiment is further described in the context of FIG. 4 and allows avoiding damage to the component box during handling and installation of the BIP assembly.

In certain embodiments, BIP assembly 300 includes aligning features 322 positioned on the back side of base sheet 304 and configured to align assembly 300 with respect to various components of the building structure. For example, aligning features 322 may be configured to snugly fit around the roof rafter and ensure that this or other roof rafters has sufficient clearance from and does not interfere with cavity 320.

Figure 4:
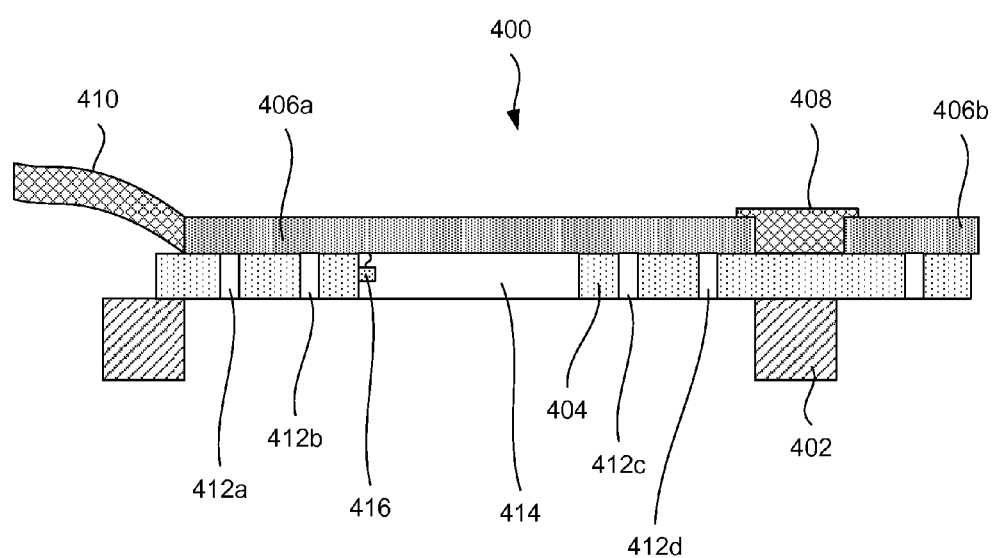
FIG. 4 is a schematic side cross-section view of a portion of the BIP assembly in accordance with certain embodiments.

FIG. 4 is a schematic side cross-section view of a portion of a BIP assembly 400 further exemplifying some features of the assembly. BIP assembly 400 is shown having a base sheet 404 and photovoltaic inserts 406a and 406b supported by the front side of base sheet 404. Photovoltaic inserts 406a and 406b may be separated by a spacer 408. This spacer 408 may be used for sealing the gap between inserts 406a and 406b as well as for providing mechanical support to photovoltaic inserts 406a and 406b with respect to base sheet 404. In certain embodiments, spacer 408 includes one or more brackets mechanically fastened to base sheet 404 and extending over inserts 406a and 406b. Spacer 408 may be injection molded during fabrication of BIP assembly 400. Some examples of materials that can be used for spacer 408 includes polyethylene terephthalate (e.g., RYNITE® available from Du Pont in Wilmington, Del.), polybutylene terephthalate (e.g., CRASTIN® also available from Du Pont), polyphenylene sulfide (e.g., RYTON® available from Chevron Phillips in The Woodlands, Tex.), polyamide (e.g., ZYTEL® available from DuPont), polycarbonate, and polypropylene. Spacer 408 may also include electrical leads extending between inserts 406a and 406b. In this embodiment, some or all electrical connections between these and other inserts of the assembly may be made at the front side of base sheet 404. In certain embodiments, photovoltaic inserts are sized in such a way that at least some spacers align with building structures used for supporting the BIP assembly. Specifically, FIG. 4 illustrates spacer 408 aligned with a roof rafter 402.

BIP assembly 400 is also shown to have an edge flap 410 for sealing an interface with an adjacent BIP assembly. More specifically, edge flap is configured to extend over a portion of the adjacent BIP assembly. Edge flap 410 is permanently attached and sealed to base sheets 404 and photovoltaic insert 406a during fabrication of BIP assembly 400. During installation, edge flap 410 may be also attached and sealed with respect to the adjacent assembly. For example, a sealant and/or adhesive may be distributed in between edge flap 410 and the other assembly during installation.

BIP assembly 400 is shown to include a back side cavity 414 with an electrical connector 416 positioned within cavity 414. Cavity 414 may include a component box, which in turn may be used to position inverters and other electrical components as described above. Base sheet 404 is also shown to include cooling perforations 412a-412d such as are described above in the context of FIG. 11B.

Figure 5:
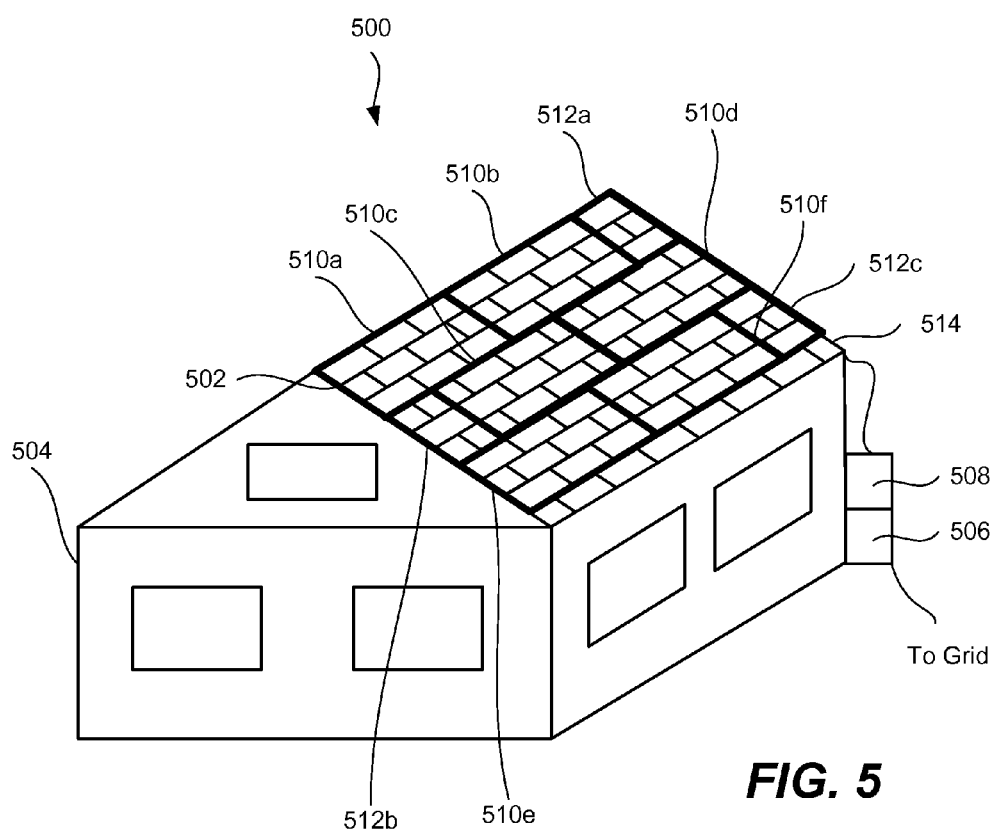
FIG. 5 is a schematic illustration of a photovoltaic array installed on a rooftop of a building structure for protecting this building structure from the environment as well as producing electricity in accordance with certain embodiments.

FIG. 5 is a schematic illustration of a photovoltaic array 500 in accordance with certain embodiments installed on a rooftop 502 of a building structure 504 for protecting the building structure 504 from the environment as well as producing electricity. Photovoltaic array 500 is shown to include six full BIP assemblies 510a-510f, three partial BIP assemblies 512a-512c, and a set of look-a-like inserts 514. For example, a rooftop 502 may be 19 feet long and 5 feet wide. Full BIP assemblies 510a-510f may be 8 feet long and 4 feet wide as described above. When a top row of BIP assemblies is installed only two full BIP assemblies 510a and 510b may be used leaving a space that is 3 feet long and 4 feet wide uncovered. This space is covered by a partial BIP assembly 512a. Similarly, the middle row may include only two full BIP assemblies 510c and 510d and one partial BIP assembly 512b, while the bottom row may include two full BIP assembly 510e and 510f and one partial BIP assembly 512c. BIP assemblies in each row are shown shifted with respect to adjacent rows, which may be done for mechanical integrity, moisture sealing and other reasons. When three rows of modules are installed covering a 12 foot wide portion of rooftop 502, one foot remains uncovered. If such small BIP assemblies are not available, this remaining portion may be covered with set of look-a-like inserts 514. As described above, these look-a-like inserts may have visual appearance of BIP modules but do not include photovoltaic or electrical components. As such these inserts may be cut into any size and shape to fill the remaining portions of the rooftop such as shown in FIG. 5. Furthermore, some portions of rooftop 502 may be covered with conventional roofing materials, e.g., asphalt shingles.

Six full BIP assemblies 510a-510f and three partial BIP assemblies 512a-512c are electrically connected with each other and/or other electrical components of array 500. Photovoltaic array 500 may be used to supply electricity to building structure 504 and/or to an electrical grid. In certain embodiments, photovoltaic array 500 includes an inverter 506 and/or a battery pack 508. Inverter 506 is used for converting a direct current (DC) generated by BIP modules 100 into an alternating current (AC). Inverter 506 may be also configured to adjust a voltage provided by BIP modules 100 or sets of BIP modules 100 to a level that can be utilized by building structure 504 or by a power grid. In certain embodiments, inverter 506 is rated up to 600 volts DC input and/or up to 10 kW power. Examples of inverters include a photovoltaic static inverter (e.g., BWT10250—Gridtec 10, available from Trace Technologies in Livermore, Calif.) and a string inverter (e.g. Sunny Boy RTM.2500 available from SMA America in Grass Valley, Calif.). In certain embodiments, BIP modules may include integrated inverters, i.e., "on module" inverters. These inverters may be used in addition to or instead of external inverter 506. Battery pack 508 may be used to balance electric power output and consumption.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A building integrable photovoltaic assembly comprising:
   a plurality of electrically interconnected photovoltaic inserts, each photovoltaic insert comprising photovoltaic cell;
   a plurality of sets of electrical leads each extending from a different one of the plurality of electrically interconnected photovoltaic inserts; and
   a single base sheet comprising a front side supporting the plurality of electrically interconnected photovoltaic inserts and a back side for attaching to a building structure, the base sheet comprising a plurality of through holes, each of the inserts is attached to the front side of the single base sheet,
   wherein at least one of the sets of electrical leads of the plurality of photovoltaic inserts extends into at least one of the plurality of through holes such that the at least one set of electrical leads is electrically connected on the back side of the base sheet to at least one of a) an electrical component and b) another one of the sets of electrical leads of the plurality sets of electrical leads.

2. The building integrable photovoltaic assembly of claim 1, wherein the base sheet comprises at least one of plywood and oriented strand board.

3. The building integrable photovoltaic assembly of claim 1, wherein the base sheet is about 4 feet wide and about 8 feet long.

4. The building integrable photovoltaic assembly of claim 1, wherein the base sheet comprises a back side cavity configured to accommodate a component box.

5. The building integrable photovoltaic assembly of claim 4, wherein the cavity contains a component box that does not extend beyond at least one of a front side and a back side of the base sheet.

6. The building integrable photovoltaic assembly of claim 4, wherein the component box comprises a connector for connecting to an inverter.

7. The building integrable photovoltaic assembly of claim 6, wherein the component box is configured to accommodate an inverter.

8. The building integrable photovoltaic assembly of claim 6, further comprising an inverter wherein the inverter is installable into and removable from the component box.

9. The building integrable photovoltaic assembly of claim 1, wherein the plurality of through holes and a back side cavity are configured to align between structural members of the building structure.

10. The building integrable photovoltaic assembly of claim 1, wherein the plurality of electrically interconnected photovoltaic inserts are arranged into a plurality of rows, each row comprising a separate set of electrically interconnected photovoltaic inserts.

11. The building integrable photovoltaic assembly of claim 10, wherein each row is offset with respect to an adjacent row of the plurality of rows.

12. The building integrable photovoltaic assembly of claim 1, further comprising a sealing material dispensed at interfaces of the plurality of electrically interconnected photovoltaic inserts to provide environmental protection to the base sheet.

13. The building integrable photovoltaic assembly of claim 1, further comprising a sealing flap for extending under or over an adjacent building integrable photovoltaic assembly.

14. The building integrable photovoltaic assembly of claim 1, wherein the base sheet includes cooling perforations exposing portions of insert back sides of the plurality of electrically interconnected photovoltaic inserts.

15. The building integrable photovoltaic assembly of claim 1, further comprising nail pointers positioned in between photovoltaic inserts of the plurality of electrically interconnected photovoltaic inserts.

16. The building integrable photovoltaic assembly of claim 15, further comprising nail cover flaps configured to cover the nail pointers.

17. The building integrable photovoltaic assembly of claim 1, further comprising alignment features positioned on the back side of the base sheet and configured to align the building integrable photovoltaic assembly with respect to components of the building structure.

18. The building integrable photovoltaic assembly of claim 1, further comprising an electrical connector for electrically interconnecting the building integrable photovoltaic assembly with at least one other building integrable photovoltaic assembly.

19. The building integrable photovoltaic assembly of claim 18, wherein the electrical connector is positioned along an edge of the base sheet.

20. The building integrable photovoltaic assembly of claim 19, wherein the electrical connector is positioned near a corner of the base sheet.

* * * * *